(12) United States Patent  
Adham et al.

(10) Patent No.: US 8,942,051 B2
(45) Date of Patent: Jan. 27, 2015

(54) MECHANISMS FOR BUILT-IN SELF TEST AND REPAIR FOR MEMORY DEVICES

(75) Inventors: Saman Adham, Kanata (CA); Chao-Jung Hung, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 209 days.

(21) Appl. No.: 13/560,571

(22) Filed: Jul. 27, 2012

(65) Prior Publication Data

US 2014/0029362 A1 Jan. 30, 2014

(51) Int. Cl.
*G11C 29/00* (2006.01)

(52) U.S. Cl.
USPC .................. 365/200; 365/94; 365/185.22

(58) Field of Classification Search
USPC ...................... 365/200, 94, 185.22
See application file for complete search history.

(56) References Cited

U.S. PATENT DOCUMENTS

| | | | | |
|---|---|---|---|---|
| 6,085,334 A * | 7/2000 | Giles et al. | ................... | 714/6.32 |
| 6,707,718 B1 * | 3/2004 | Halim et al. | ............. | 365/185.22 |
| 7,441,165 B2 * | 10/2008 | Tseng et al. | ................... | 714/718 |
| 8,122,307 B1 * | 2/2012 | Lindhorst et al. | ............. | 714/719 |
| 8,405,412 B2 * | 3/2013 | Kohler et al. | ............. | 324/750.3 |
| 8,526,254 B2 * | 9/2013 | Kurjanowicz | ................ | 365/201 |

* cited by examiner

*Primary Examiner* — Pho M Luu

(74) *Attorney, Agent, or Firm* — Lowe Hauptman & Ham, LLP

(57) ABSTRACT

This description relates to a system for storing repair data of a random access memory (RAM) array in a one-time programming memory (OTPM). The system includes the RAM array, wherein the RAM array includes a main memory, redundant rows and columns, and a first repair register memory. The system further includes a built-in self-test-and-repair (BISTR) module having a second repair register memory, wherein the BISTR module is used to test and repair the RAM array. The system further includes the one-time programming memory (OTPM) for storing repair data from more than one test and repair stages for the RAM array, wherein the repair data from different test and repair stages are stored in a same data segment.

20 Claims, 14 Drawing Sheets

MECHANISMS FOR BUILT-IN SELF TEST AND REPAIR FOR MEMORY DEVICES

CROSS REFERENCES TO RELATED APPLICATIONS

The present application is related to U.S. application Ser. No. 13/291,747, entitled "Mechanisms for Built-In Self Repair of Memory Devices" and filed on Nov. 8, 2011, U.S. application Ser. No. 13/291,620, entitled "Mechanisms for Built-In Self Repair of Memory Devices Using Failed Bit Maps and Obvious Repairs" and filed on Nov. 8, 2011, and U.S. application Ser. No. 13/291,707, entitled "Mechanisms for Built-In Self Repair of Memory Devices Using Failed Bit Maps and Obvious Repairs" and filed on Nov. 8, 2011. The above-mentioned applications are incorporated herein by reference in their entireties.

FIELD

The present disclosure relates generally to self-testing and self-repairing of memories.

BACKGROUND

Integrated circuits have experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

A volume occupied by the integrated components is near the surface of the semiconductor wafer. Although dramatic improvements in lithography have resulted in considerable improvements in two-dimensional (2D) integrated circuit formation, there are physical limitations to the density that can be achieved in two dimensions. One of these limitations is the minimum size needed to make these components. Further, when more devices are put into one chip, more complex designs are required. An additional limitation comes from the significant gains in the number and length of interconnections between devices as the number of devices increases. When the number and length of interconnections increase, both circuit RC delay and power consumption increase. Three-dimensional integrated circuits (3DIC) were thus proposed, wherein dies are stacked, with wire-bonding, flip-chip bonding, and/or through-silicon vias (TSV) being used to stack the dies together and to connect the dies to package substrates.

Memories, either volatile or nonvolatile, are among the most widely used cores in current three-dimensional integrated circuit (3DIC) implementations. Memories can exist as memory dies to be integrated with separate logic dies or exist as embedded memories to be part of logic dies. Advanced memory dies and embedded memory devices both have high device densities and occupy large chip areas. A probability that a defect lies within a memory die or embedded memory is relatively high. The memory die or embedded memory thus becomes a controlling factor in die yield. 3DIC manufacturing involves packaging of dies and bonding of packaged dies. The packaging and bonding processes impact the yield of final product.

DETAILED DESCRIPTION

Figure 1:
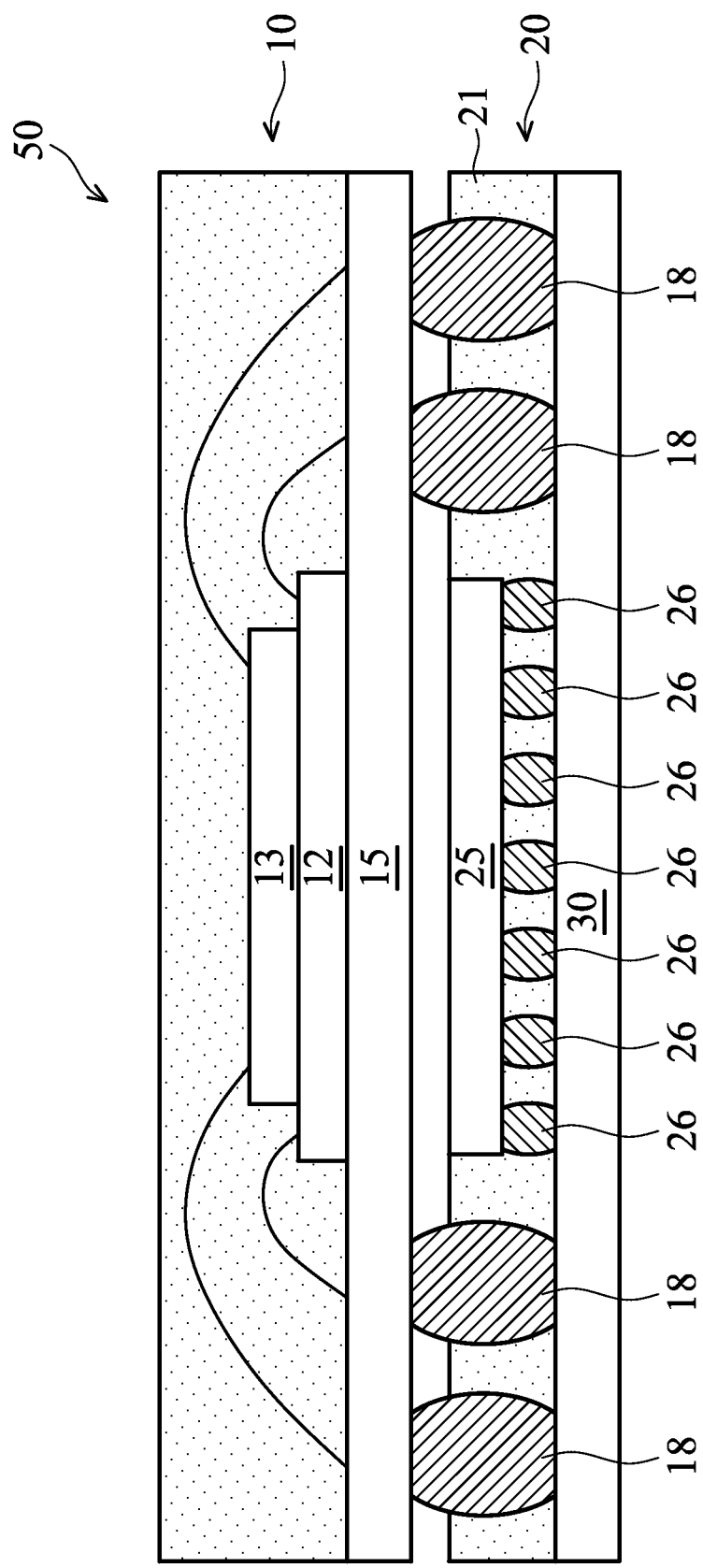
FIG. 1 is a schematic cross-sectional view of a three-dimensional integrated circuit (3DIC) structure, in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of a three-dimensional integrated circuit (3DIC) structure 50, in accordance with some embodiments. 3DIC structure 50 includes a package 20, which includes a semiconductor die 25. The semiconductor die 25 includes a substrate as employed in a semiconductor integrated circuit fabrication, and integrated circuits are formed therein and/or thereupon. Examples of the various microelectronic elements that may be formed in the semiconductor die 25 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. The microelectronic elements are interconnected to form the integrated circuit device, such as a logic device, memory device (e.g., SRAM), radio frequency (RF) device, input/output (I/O) device, system-on-chip (SoC) device, combinations thereof, and other suitable types of devices.

Semiconductor die 25 is bonded to a substrate 30 by a number of connectors 26. In some embodiments, connectors 26 are bumps, such as solder bumps, copper pillar bumps, etc. Connectors 26 make contacts with conductive structures (not shown) on the surface of semiconductor die 25 and conductive structures (not shown) on the surface of substrate 30. Substrate 30 may be a semiconductor wafer, or a portion of a wafer. Substrate 30 may include interconnect structures, passive devices such as resistors, capacitors, inductors and the like, and/or active devices such as transistors. In some embodiments, substrate 30 includes additional integrated circuits. Substrates 30 may further include Through Silicon Vias (TSVs) and may be an interposer. In addition, the substrate 30 may be made of other materials. For example, in some embodiments, substrate 30 is a multiple-layer circuit board. In some embodiments, substrate 30 also includes bismaleimide triazine (BT) resin, FR-4 (a composite material composed of woven fiberglass cloth with an epoxy resin binder that is flame resistant), FR-5, ceramic, glass, plastic, tape, film, or other supporting materials that carries conductive pads or lands needed to receive conductive terminals.

FIG. 1 shows that package 20 is bonded to package 10 via connectors 18, which surround semiconductor die 25. Connectors 18 provide electrical connections between dies 12 and 13 in package 10 and die 25 in package 20. A portion of connectors 18 are embedded in a molding compound 21, which is deposited on substrate 30. Package 10 includes two semiconductor dies 12 and 13, with die 13 disposed over die 12. In some embodiments, a glue layer (not shown) is between dies 12 and 13. Semiconductor dies 12 and 13 may include various microelectronic elements, as described above for semiconductor die 25. Semiconductor die 12 is bonded to a substrate 15. Substrate 15 may include various materials and/or components described above for substrate 30. Semiconductor die 12 is electrically connected to conductive elements (not shown) in substrate 15 via bonding wires 14, in accordance with some embodiments. Similarly, semiconductor die 13 is electrically connected to the conductive elements in substrate 15 via bonding wires 16. Package 10 also includes a molding compound 11, which covers semiconductor dies 12 and 13, and also bonding wires 14 and 16. Bonding wires 14 and 16 are electrically connected to connectors 18, which are electrically connected to die 25 via connectors 26.

Random access memories (RAMs), or memories, are among the most widely used cores in current three-dimensional integrated circuit (3DIC) implementations. Such memories could be volatile or non-volatile. Memories can exist as memory dies to be integrated with separate logic dies or exist as embedded memories to be part of logic dies. Advanced memory dies and embedded memory devices both have high device densities and occupy large chip areas. A probability that a defect lies within a memory die or embedded memory is relatively high. Defects on memory dies and/or embedded memories affect die yield.

The manufacturing of 3DICs involves complex substrate processing operations and handling. To prepare 3DIC structures, such as structure 50 shown in FIG. 1, dies are pre-tested to separate the good dies from bad dies. Only good dies are selected for the construction of the 3DIC structures. Selected (or good) dies are stacked and packaged together to form the 3DIC structures. As mentioned above, the probability that a defect lies within a memory die or embedded memory is relatively high. To improve yield of memory dies or dies with embedded memories, redundant rows and columns are provided to repair failed memory bits. However, during the packaging process to form 3DIC structures, the manufacturing process(es) can introduce new bit failures. Therefore, additional test and repair of memories are conducted at different points of the stacking and packaging process to determine the functionality of the memory devices and the quality of the manufacturing process. For example, dies 12 and 13 could be memory dies. Dies 12 and 13 are tested and repaired before being packaged to form package 10. During the formation of package 10, the packaging processes may include bonding of die 12 to substrate 15, gluing die 13 to die 12, the formation of wires 14 and 16, and depositing molding compound 11 over dies (12 and 13) and substrate 15. These packaging processes involve applying force on the package structures and thermal cycles, such as to reflow solder. These processes can cause problems, such as interfacial delamination due to mismatch of thermal expansion coefficients (CTEs), and induce new bit failures in the memory devices (or RAMs) of dies 12 and/or 13. Therefore, after package 10 is formed, memory dies 12 and 13 (memory dies) are tested and repaired again. Similarly, bonding package 10 to package 20 to form 3DIC structure 50 may also introduce new bit failures. As a result, memory dies 12 and 13 are tested and repaired again after 3DIC structure 50 is formed.

As mentioned above, in some embodiments, the defect concern in memory devices makes testing and repairing of memory arrays necessary. For embedded memories, the embedding of memory not only makes testing difficult, but also impairs testability of all other functions on chip, such as the core logic. For example, much of the testing of other functions uses the embedded memory, which must be functioning properly. The memory yield problems may be tackled by incorporating a repair scheme with redundant rows and/or columns. Built-in self-test (BIST) and built-in self-repair (BISR) are used to assist memory test and repair, in some embodiments.

Figure 2A:
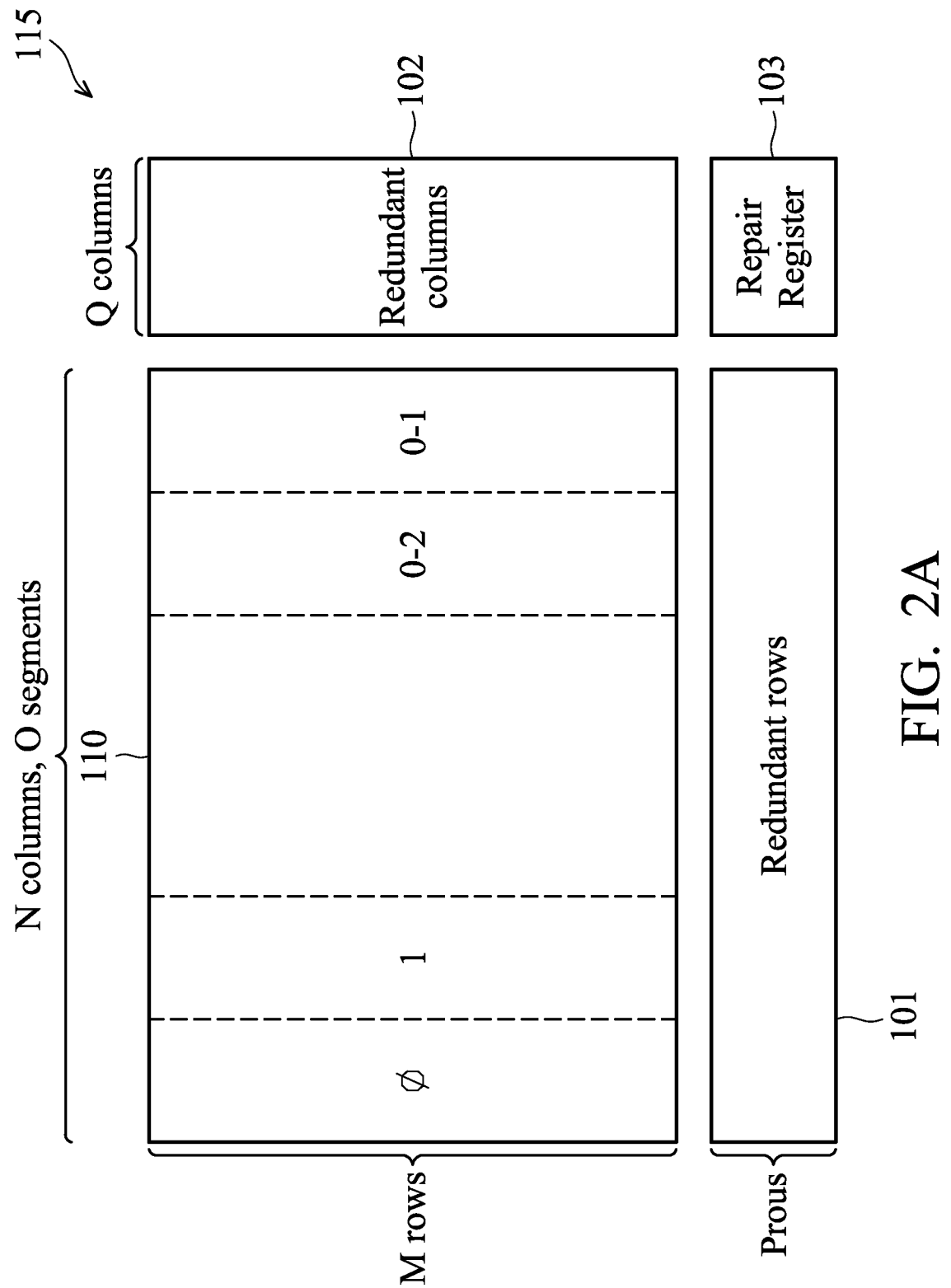
FIG. 2A is a block diagram of a memory array with redundant rows and columns, in accordance with some embodiments.

FIG. 2A is a block diagram of a memory array 115 with redundant rows and columns, in accordance with some embodiments. The memory array 115 could be a part of a memory die (or chip) or could be a part of an application-specific integrated circuit (ASIC) or a SOC device die. Memory array 115 includes a main memory 110, redundant rows 101 and redundant columns 102. Memory cells in memory array 115 could be dynamic random-access memory (DRAM) cells, static random-access memory (SRAM) cells, FLASH memory cells, electrically erasable programmable read-only memory (EEPROM) cells, magnetoresistive random-access memory (MRAM) cells, or other types of memory cells.

The main memory 110 has M rows and N columns. M and N are any integer number. The values of M and N determine the size of the main memory 110. For example, the main memory 110 may have 288 columns and 512 rows. Other numbers of columns and rows are also possible. In some embodiments, the main memory 110 may be further divided into a number of segments, such as O segments. O is any integer number. In some embodiments, the segments are equal in size. For example, main memory 110 could have 8 segments, which are divided by columns. Using the exemplary main memory 110 described above, each segment has 36 columns if there are 288 columns and 8 segments. Alternatively, the segments may be divided by rows.

The redundant rows 101 and the redundant columns 102 are rows and columns of memory cells that are used for repairing failed cells (or bits) in the main memory 110. In some embodiments, the redundant rows 101 are used for row repair and the redundant columns 102 are used for column repair. The numbers of redundant rows 101 and columns 102 depend on the size of main memory 110 and also on the manufacturing processes used to make main memory 110. Larger main memory 110 (with more rows and columns) may require more redundant rows and columns to assist in failed cell repair. In addition, if the processes used to manufacture the device have high yield, the numbers of redundant rows and columns could be lower. In contrast, if the processes have low yield, the numbers of redundant rows and columns would be higher. As shown in FIG. 2A, the main memory 110 has P redundant rows and Q redundant columns. P and Q are integers. P is smaller than M and Q is smaller than N, in accordance with some embodiments. For example, if there are 288 columns and 512 rows in main memory 110, there could be 16 redundant rows and 8 redundant columns. Other numbers of redundant rows or columns are also possible. In some embodiments, each redundant column is used to repair failed memory cell(s) in one designated segment. Under such circumstance, Q is equal to the number of segments O. The memory cell described here may refer to a memory unit, which may comprise a number of transistors. In some embodiments, error and repair addresses are stored in a repair register 103.

Figure 2B:
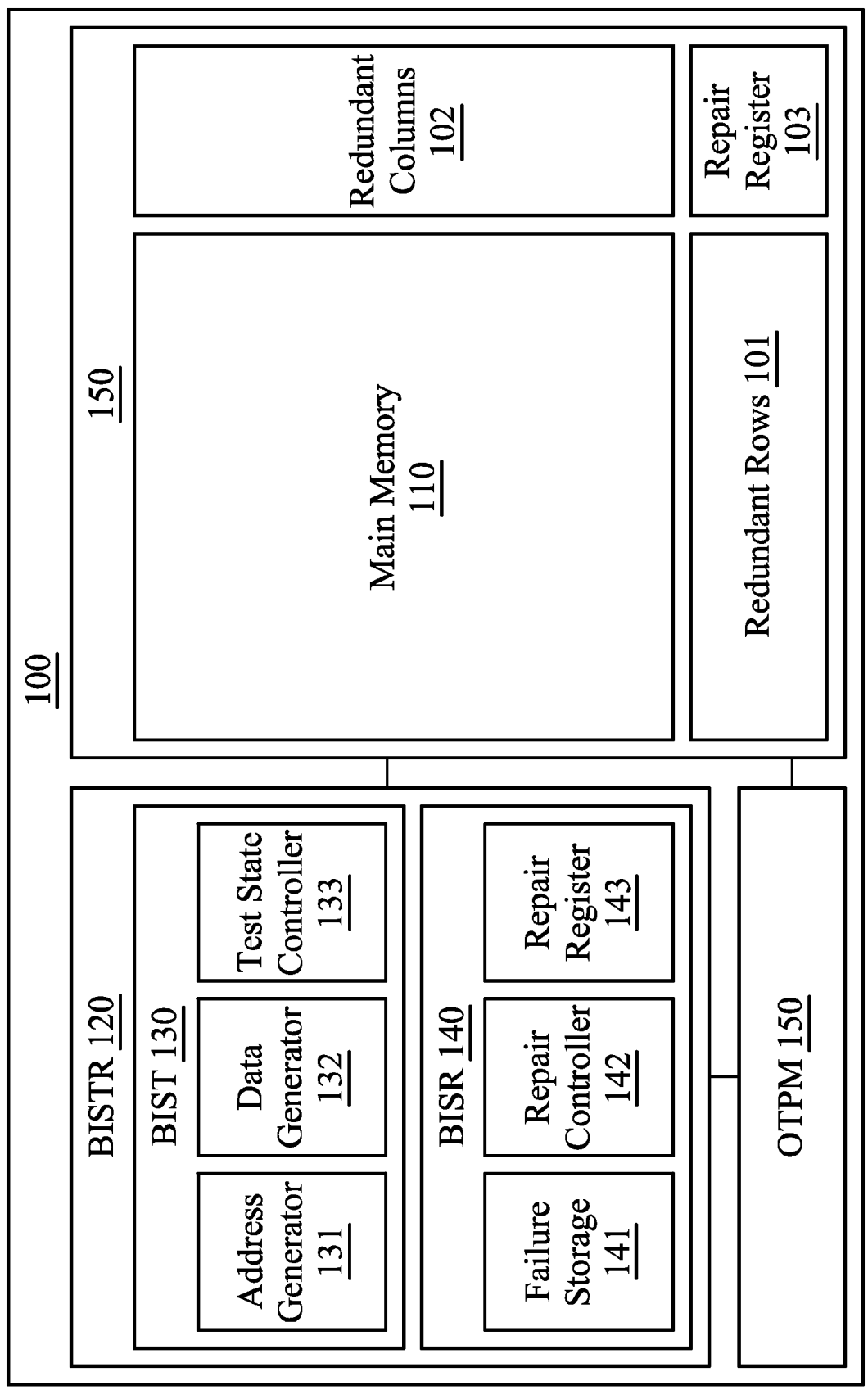
FIG. 2B is a schematic diagram of a memory array with a built-in self-test-and-repair (BISTR) module and a one-time programming memory (OTPM), in accordance with some embodiments.

FIG. 2B is a schematic diagram of a memory 100 with a built-in self-test-and-repair (BISTR) module 120 and a one-time programming memory (OTPM) 150, in accordance with some embodiments. Memory 100 includes a memory array 115 with main memory 110, redundant rows 101 and redundant 102. The BISTR module 120 provides the functions of testing and repairing main memory 115. The BISTR module 120 includes a built-in self test (BIST) module 130 for testing the main memory 110 and a built-in self repair (BISR) module 140 for repairing the main memory 110, in accordance with some embodiments. The BIST module 130 may include an address generator 131, which generates and provides address sequences to the main memory 110 during testing in accordance with some embodiments. The BIST module 130 may further includes a data generator 132, which generates and provides test data sequences to the main memory 110 during testing. The address sequences and the data sequences are generated in specified orders by a test pattern algorithm, in some embodiments. The data sequences may provide a set of data bits to detect various types of faults within the main memory 110. In addition, the BIST module 130 may include a test state controller 133, which provides inputs and control signals to the address generator 131 and the data generator 132. The test pattern algorithm described above may be generated by the test state controller 133. The BIST module 130 may scan the main memory 110 by row, by column, or a combination of both to test the entire main memory 110.

The BISR module 140 analyzes the received error (or failure) data generated from testing the main memory 110. The error (or failure) data may include an address(es) of the error(s) (or failed cells), also possibly along with the other received (or collected) error information, to determine the repair mechanism(s). Depending on the location and distribution of the error data, the repair could be done by row repair and/or column repair. The BISR module 140 may include a failure storage 141, which stores addresses of the failed memory cells. The failure storage 141 may also store the failure types associated with the failed memory cells. However, the storage of the failure types is not necessary.

The BISR module 140 may further include a repair controller 142 and a repair register 143. The repair controller 142 analyzes the failure data stored in failure storage 141 and determines the repair method(s), such as by row repair, by column repair, or by a combination of both. The repair controller 142 may use an algorithm to repair faulty memory cells. For example, the BISR module 140 may repair the detected failed memory cells as soon as they are discovered. As mentioned above, the BIST module 130 scans the main memory 110 and sends failure information to failure storage 141. The repair controller 142 may initiate repair based on the available failure data in the failure storage 141 before the scanning of the entire main memory 110 is completed. Such repair algorithm is relatively simple to implement and the failure storage 141 required is relatively small. For example, if the test sequences generated by the BIST module 130 identify a particular row of a failed cell, the failure location is sent to the failure storage 141. When the repair controller 142 detects such error, the repair controller 142 could immediately initiate a row repair. Afterwards, the BISTR 120 continues with the scanning (and testing) and repairing of the remaining portion of the memory. Alternatively, an algorithm using a failure bit map may be utilized to determine the repair mechanism.

Details of a number of exemplary repair mechanisms are described in U.S. application Ser. No. 13/291,747, entitled "Mechanisms for Built-In Self Repair of Memory Devices" and filed on Nov. 8, 2011, U.S. application Ser. No. 13/291,620, entitled "Mechanisms for Built-In Self Repair of Memory Devices Using Failed Bit Maps and Obvious Repairs" and filed on Nov. 8, 2011, and U.S. application Ser. No. 13/291,707, entitled "Mechanisms for Built-In Self Repair of Memory Devices Using Failed Bit Maps and Obvious Repairs" and filed on Nov. 8, 2011. The above-mentioned applications are incorporated herein by reference in their entireties.

After the repair controller 142 determines the repair method(s), the repair controller issues a repair instruction to the repair register 143. The repair instruction may include the address(es) of row(s) and/or column(s) in the main memory 110 being repaired and the address(es) of redundant row(s) and/or redundant column(s) used for the repair(s). The repair register 143 records the addresses received from the repair controller 142. When all the failed bits are repaired, the data (repair addresses) in the repair register 143 are stored in the OTPM 150 to ensure the data are not lost when the power to the memory 100 is turned off. In some embodiments, the repair controller 142 manages (or controls) the read and write of repair data of OTPM 150. In some other embodiments, there is a separate OTPM controller (not shown) in BISTR 120 for managing the read and write of OTPM 150. For main memory 110 with non-volatile memory cells, an OTPM 150 may still be used to store repair data.

When memory 100 is accessed for read or write (or operated under read or write mode), the repair addresses in OTPM 150 are loaded into repair register 103 of memory array 115 and/or repair register 143 of BISTR 120. When the memory array 100 is operated under read or write mode, the read/write address(es) is first checked against the repair addresses stored in the repair register 143 to see if the read/write address(es) is included in the repair register 143. If the answer is yes, the read/write is performed on correlated address(es) in the redundant row(s) or column(s) used for the repair. Alternatively, the read/write address of memory array 100 can be checked against repair addresses in repair register 103 of memory array 115.

Figure 2C:
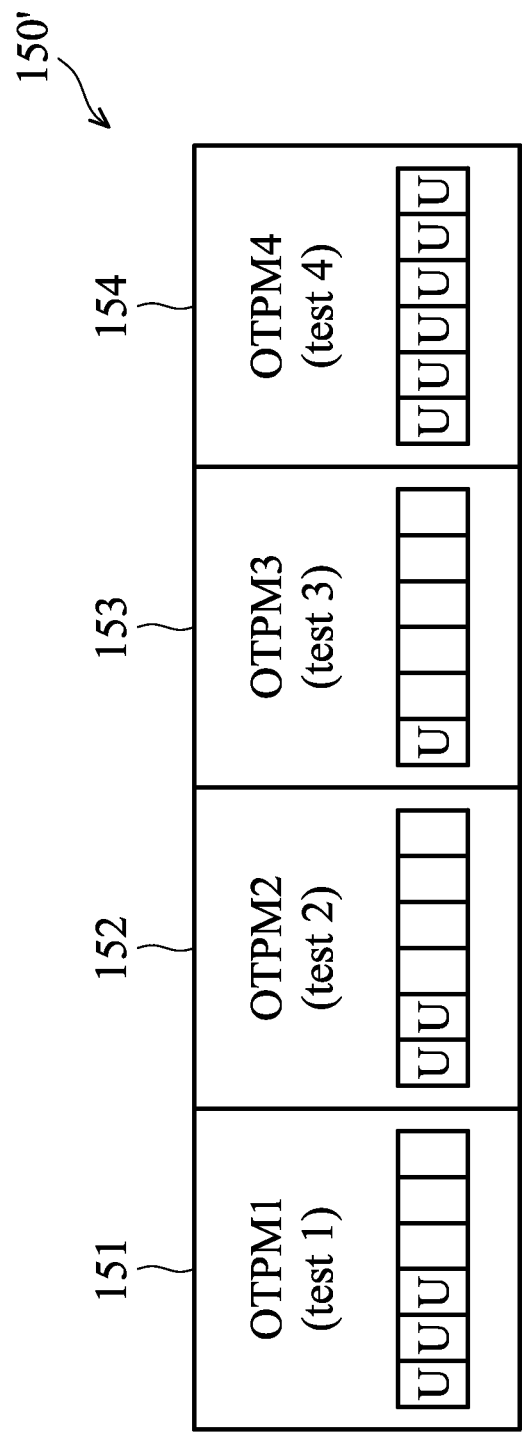
FIG. 2C is a block diagram of a partitioned OTPM, in accordance with some embodiments.

For 3DIC structures that require multi-stage testing and repair, OTPM 150 is sometimes partitioned into different dedicated segments to store repair addresses generated in each test stage. FIG. 2C is a block diagram an OTPM 150' partitioned into four segments, 151, 152, 153, and 154, to store repair addresses after 4 different test stages, in accordance with some embodiments. The memory array 115 of each die on a wafer could have been tested and repaired at wafer level (test 1) after the wafer-level manufacturing of devices and interconnect is completed to determine whether the dies are good or bad. The repair data (or addresses) of memory array 115, which may include address of failed bits and repair cells (or cells used for repair), are stored in $OTPM_1$ 151. After wafer-level testing, good dies are selected for continued processing. Another test (test 2) is then performed on good dies after the dies are sawed and stacked. The test results (repair addresses) of memory array 115 of these packaged good dies are stored in $OTPM_2$ 152. Sometimes packaging process could damage good dies, which are turned into 'bad' packaged dies. The "good" packaged dies are then bonded to substrate or to other die packages. After each stacked die is bonded to a substrate or die package to form a 3DIC structure, the 3DIC structure is tested again. The testing includes testing of memory array 115 in the structure. The repair results of memory array 115 are stored in $OTPM_3$ 153. The finished 3DIC structure could undergo a burn-in process and are tested again afterwards. The repair results of memory array 115 are stored in $OTPM_4$ 154.

The mechanisms described above of storing repair addresses of memory array 115 in designated OTPM segments enable clean identification of failures observed at different stages. In addition, the mechanisms of using designated OTPM segments to store data avoid overwriting already used OTPM cells. However, OTPM cells, such as efuse-based cells or antifuse-based cells, are typically larger than memory cells in memory arrays, which are small and in high densities. Using designated OTPM cells for multi-stage testing increases an area on the die relative to using a single OTPM, which is undesirable for some advanced devices. In addition, using the mechanisms described above could leave many OTPM cells in various segments un-used, which is waste of OTPM cells and spaced on the die surface areas. Each segment, 151, 152, 153, or 154, has a number of OTPM cells reserved for storing error address. Some of these OTPM cells are used, marked as "U" in FIG. 2C, and some are un-used (no mark). The un-used OTPM cells in each of 151, 152, 153, or 154, cannot be used to store error addresses from other test stage. In the example shown in FIG. 2C, stage-4 test-and-repair identifies many new failure bits, which occupy all allocated OTPM cells in segment 154 and needs additional STPM cells for storage. As a result, the memory array tested is considered non-usable due to insufficient OTPM cells to store error addresses. However, there are un-used OTPM cells in other segments, such as segments 151, 152, and 153. To avoid the issue of insufficient OTPM cells, OTPM cells in each segments are designed with extra cells to provide sufficient buffer (or margin), which can result in large OTPM areas.

Based on the description above, in some embodiments, having different mechanisms in storing repair addresses in OTPM 150 is desired. A mechanism that does not require partitioning OTPM into different designated segments and maximize utilization of OTPM cells would require fewer OTPM cells, consequentially less OTPM cell areas, for storing repair addresses.

Figure 3A:
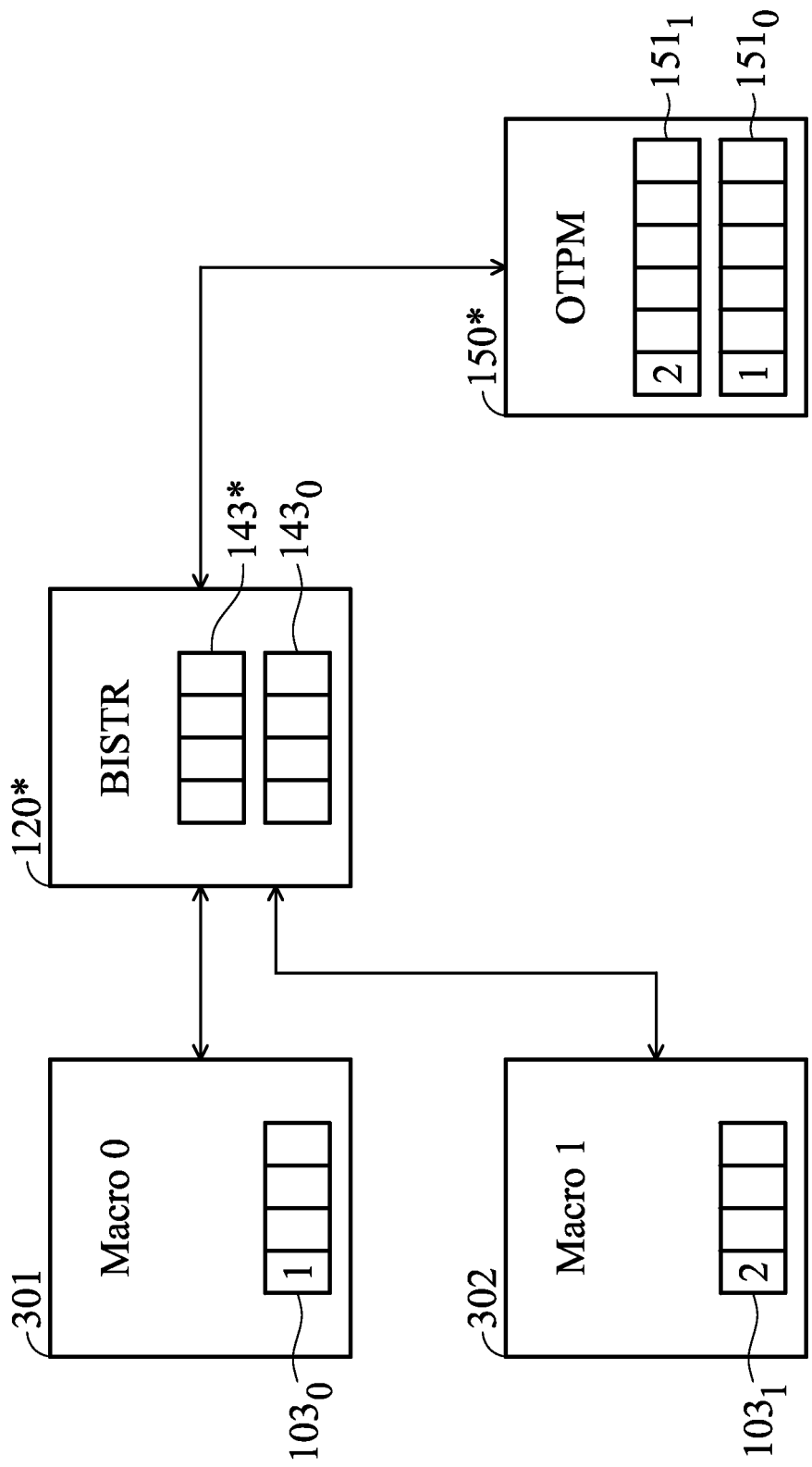
FIGS. 3A-3J are diagrams of data exchanges between two memory arrays, a BISTR module, and an OTPM at two test and repair stages, in accordance with some embodiments.

FIGS. 3A-3J are diagrams of data exchanges between memory array 301 (or macro0), memory array 302 (or macro1), BISTR module 120*, and OTPM 150* at two test and repair stages, in accordance with some embodiments. Macro0 and Macro1 are two memory arrays, similar to memory array 115, of a die. In the embodiments described, there are two memory arrays. However, two memory arrays is used as an example. Some dies may contain more than 2 memory arrays. The embodiments described in FIGS. 3A-3J could apply to dies with more memory arrays. FIG. 3A is a diagram of the data exchange at the end of first test and repair of macro0 (by BISTR 120*), macro0 has one error with an error register "1". The "1" of error register "1" in the repair register $103_0$ of macro0 is merely symbolic and it represents addresses of a failed cell and a redundant cell (or repair cell), which are also called repair data, used to repair the failed cell. Repair register $103_0$ includes memory cells used to hold error registers, or addresses of failed and repair cells of macro0. In reality, each of the addresses is represented by a number of bits that identify the rows and columns of the cell (either the failed cell or the repair cell). In FIG. 3A macro1 has an error register "2" in repair register $103_1$. The error registers "1" and "2" are identified by BISTR 120*, which includes a repair register 143* and a duplicated repair register $143_D$. The purpose and usage of the duplicated repair register $143_D$ are described below.

BISTR 120* forward the error registers "1" of macro0 and "2" of macro1 to OTPM 150* at the end of first test and repair of macro0 and macro1. OTPM 150* has allocated memory segment $151_0$ for storing error registers of macro0 and segment $151_1$ for error registers of macro1. However, segments $151_0$ and $151_1$ are for different memory arrays and are not partitioned for different test stages. FIG. 3A shows that error registers "1" and "2" are stored in segments $151_0$ and $151_1$.

Figure 3B:
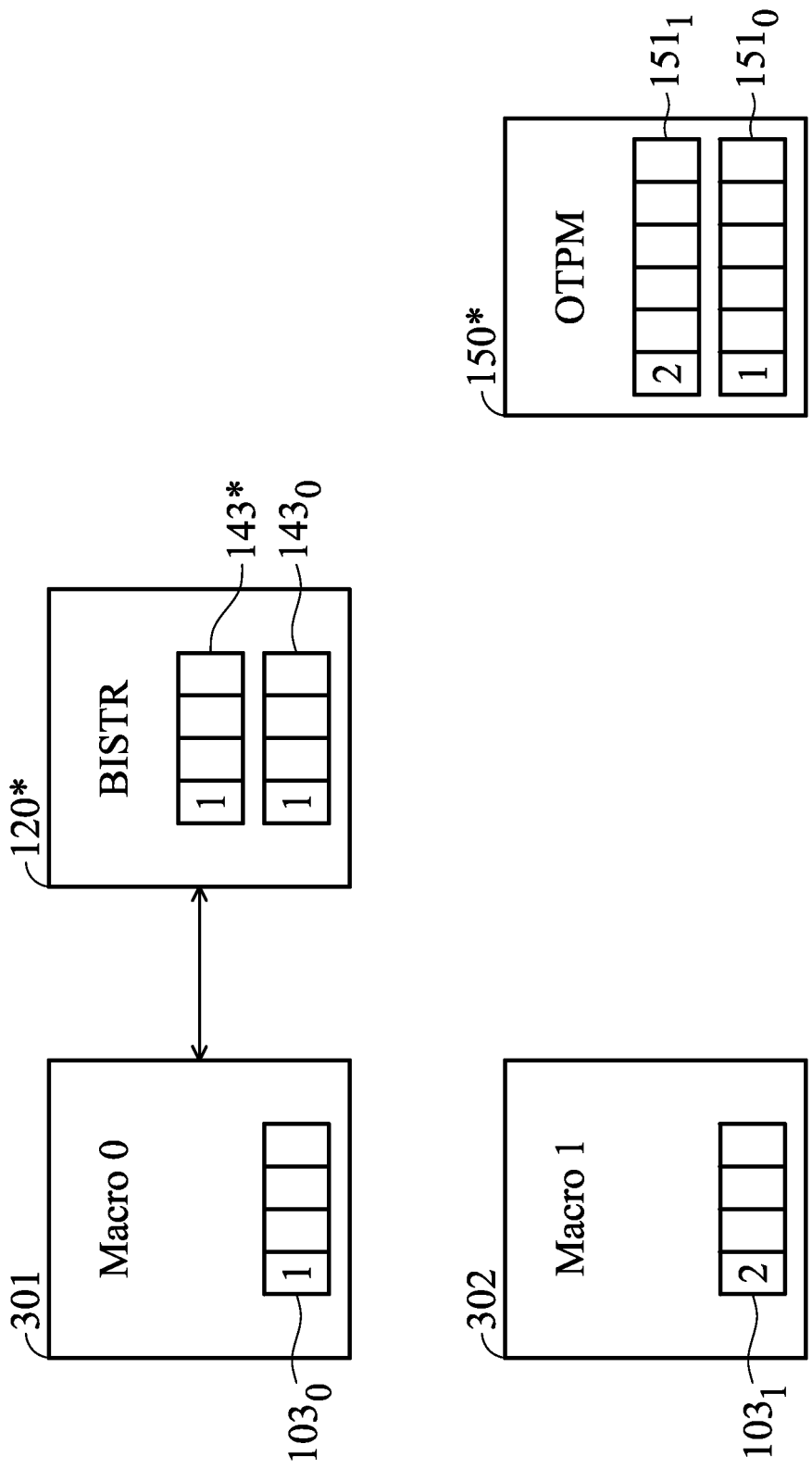

After first test and repair of macro0 and macro1, the die that includes macro0 and macro1 may undergo additional processing. Upon completing the additional processing, macro0 and macro1 undergo another round of testing and repair (second test and repair). FIG. 3B is a diagram of data exchanges when the second round of test and repair is initiated, OTPM 150* first loads error register "1" of macro0 and register "2" of macro1 to macro0 301 and macro1 302 respectively with the help of BISTR 120*. BISTR 120* then loads error register (s) in macro0, which is error register "1", to repair register 143* and duplicated repair register $143_D$. The repair register 143* and duplicated repair register $143_D$ are in separate segments. The data in repair register $143_D$ mirror the data in repair register 143*.

Figure 3C:
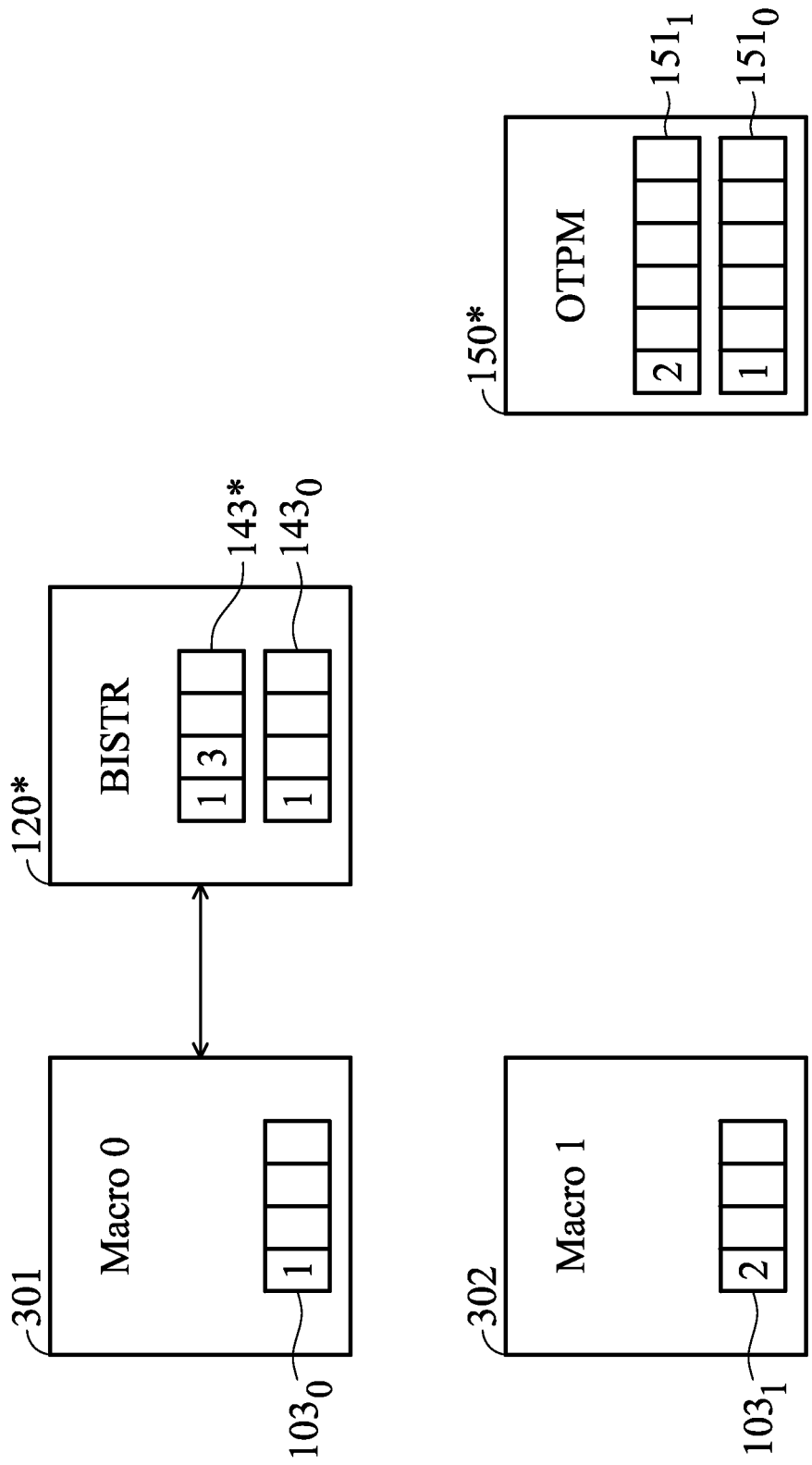
Figure 3D:
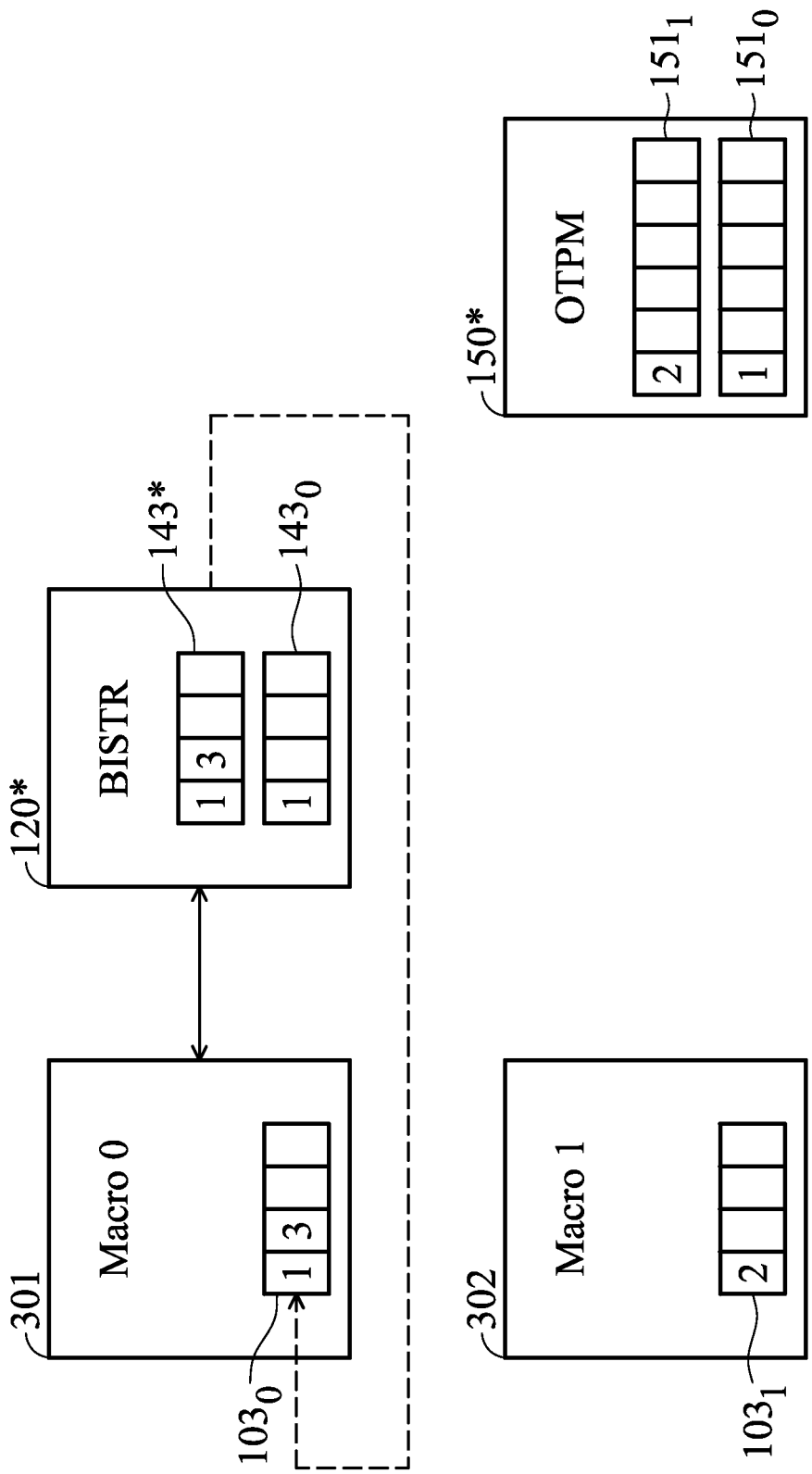

Afterwards, BISTR module 120* interacts with macro0 to conduct a second (new) testing and repairing operation to identify if there are new failed bit cells resulting from the additional processing operations performed on the die after last test and repair. The self-test and self-repair performed by BISTR 120* identifies a new failed bit, which is error register "3". The error register "3" is stored in repair register 143*, as shown in FIG. 3C. After BISTR 120* determines and stores the error register "3", BISTR 120* sends the error register "3" to macro0 to be stored in repair register $103_0$ of macro0, as shown in FIG. 3D.

Figure 3E:
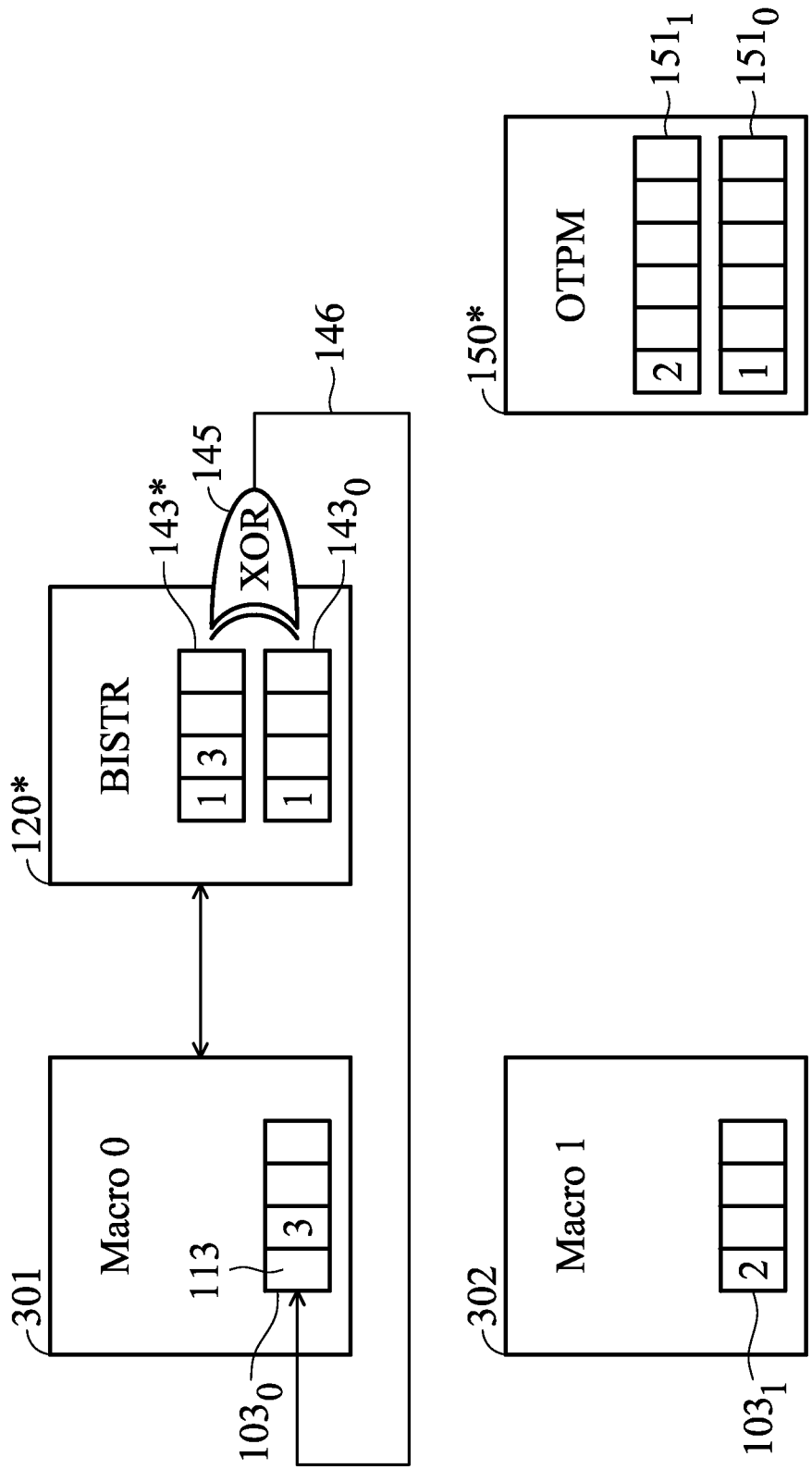
Figure 3F:
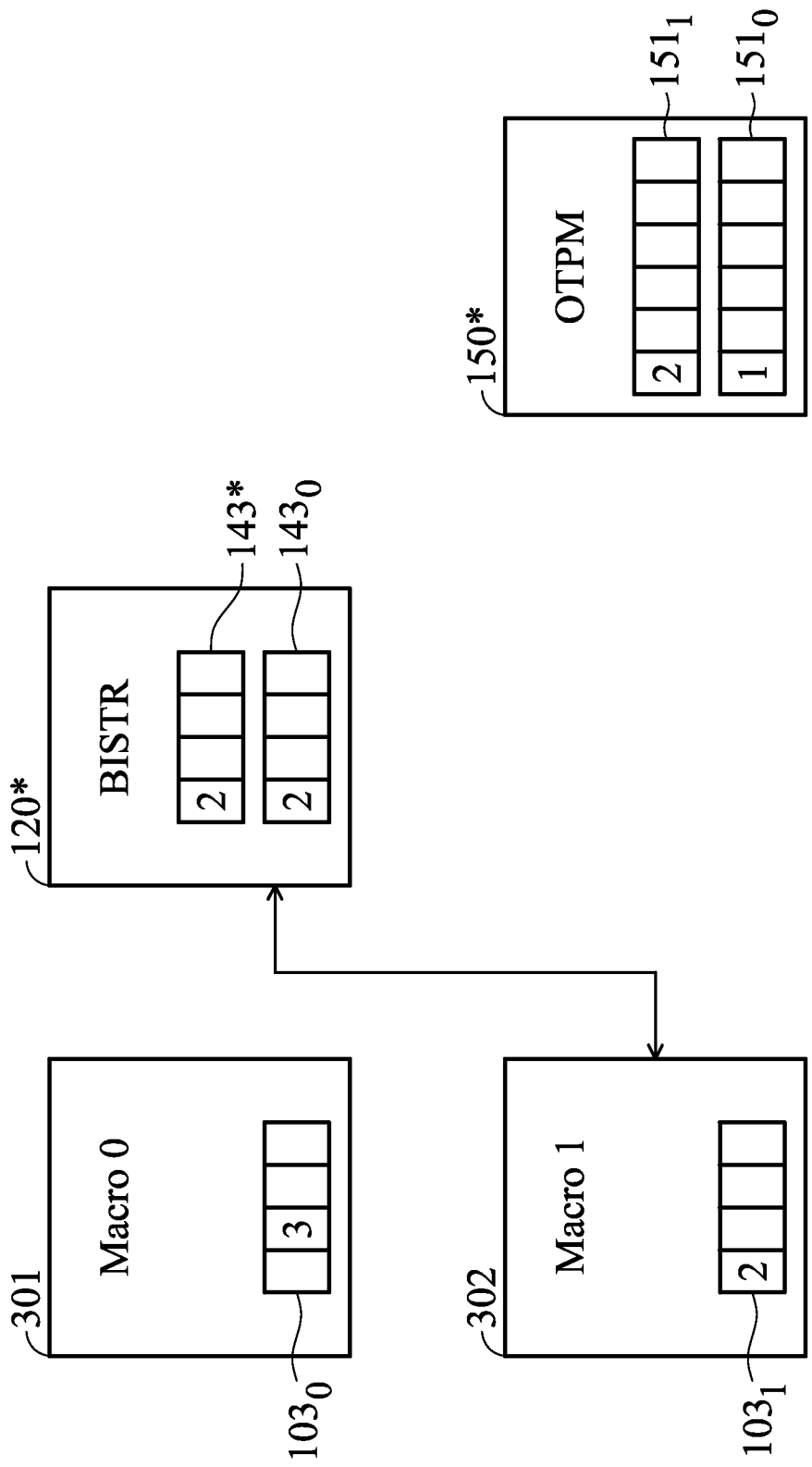
Figure 3G:
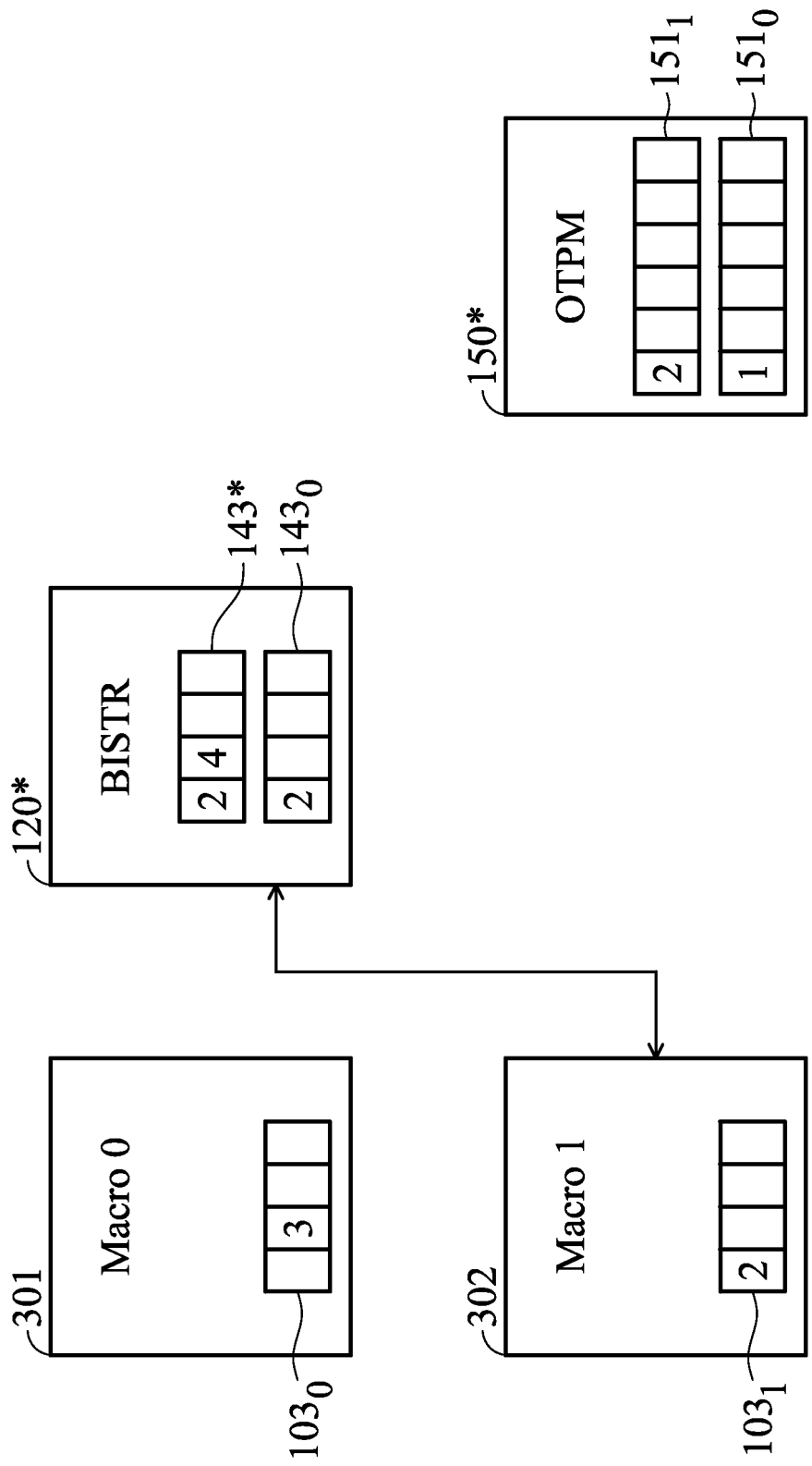
Figure 3H:
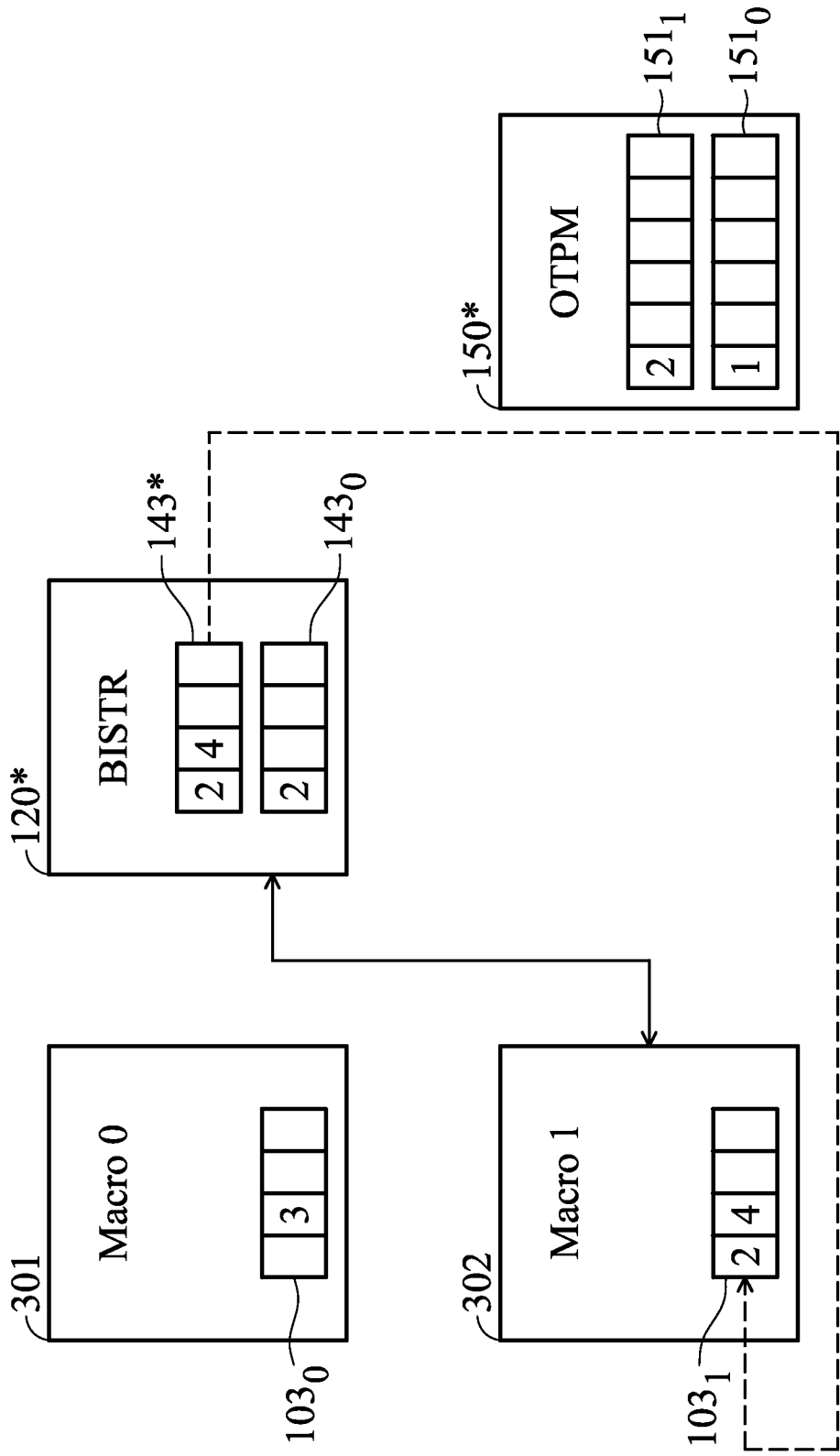

After the second test and repair is completed for macro0, the error registered stored in repair registers 143* and $143_D$ are sent to the inputs of a comparator (an XOR gate) 145 in the BISTR 120*. The output of the XOR gate 145 is sent to error register $103_0$ of macro0 by connection 146. Since error register "1" is in both repair register 143* and duplicated repair register $143_D$, the error register "1" would become null, which is stored in the memory cells 113 previously used to keep error register "1" as shown in FIG. 3E. In contrast, the error register "3" would stay stored in repair register $103_0$.

Figure 3I:
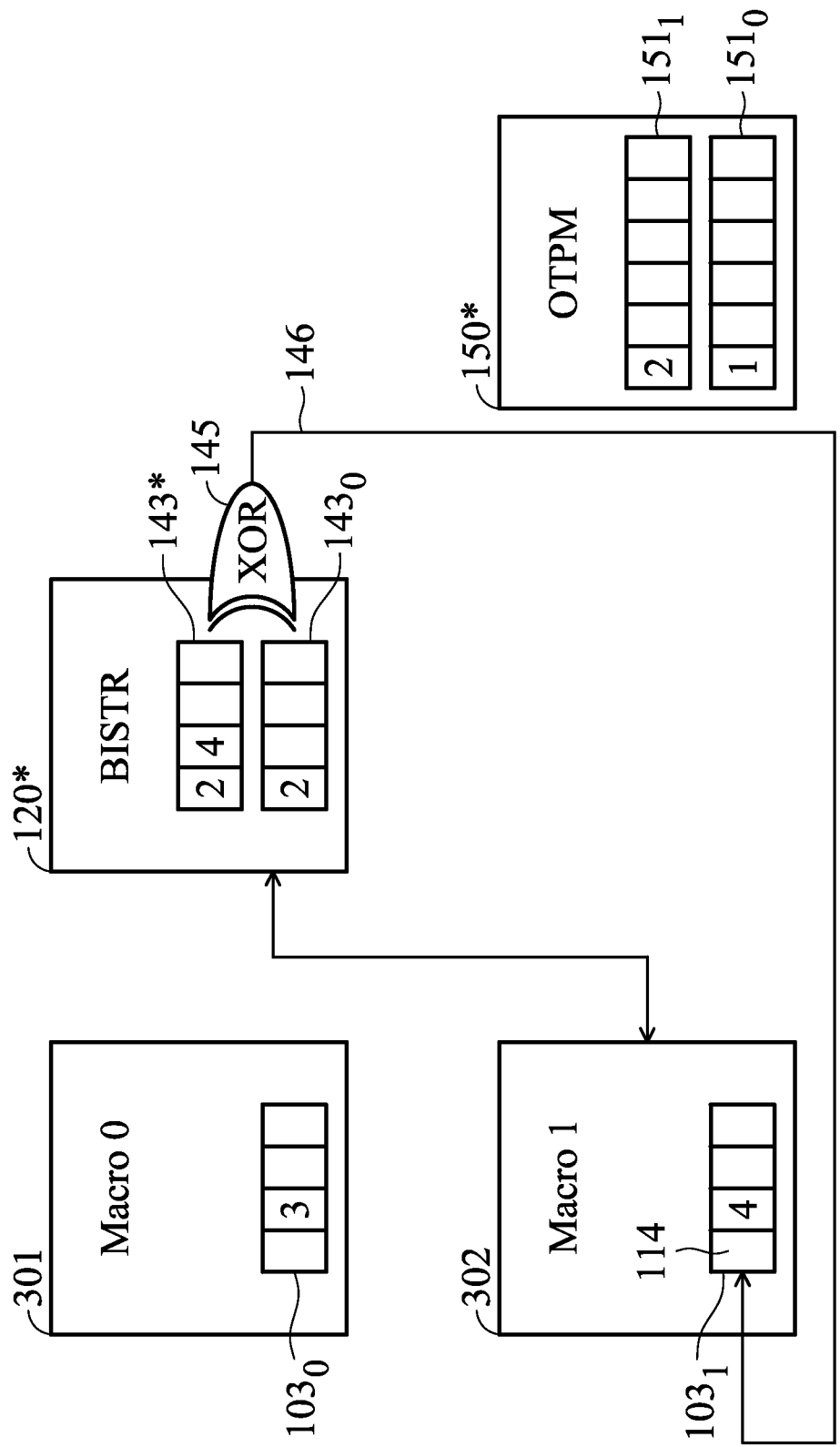
Figure 3J:
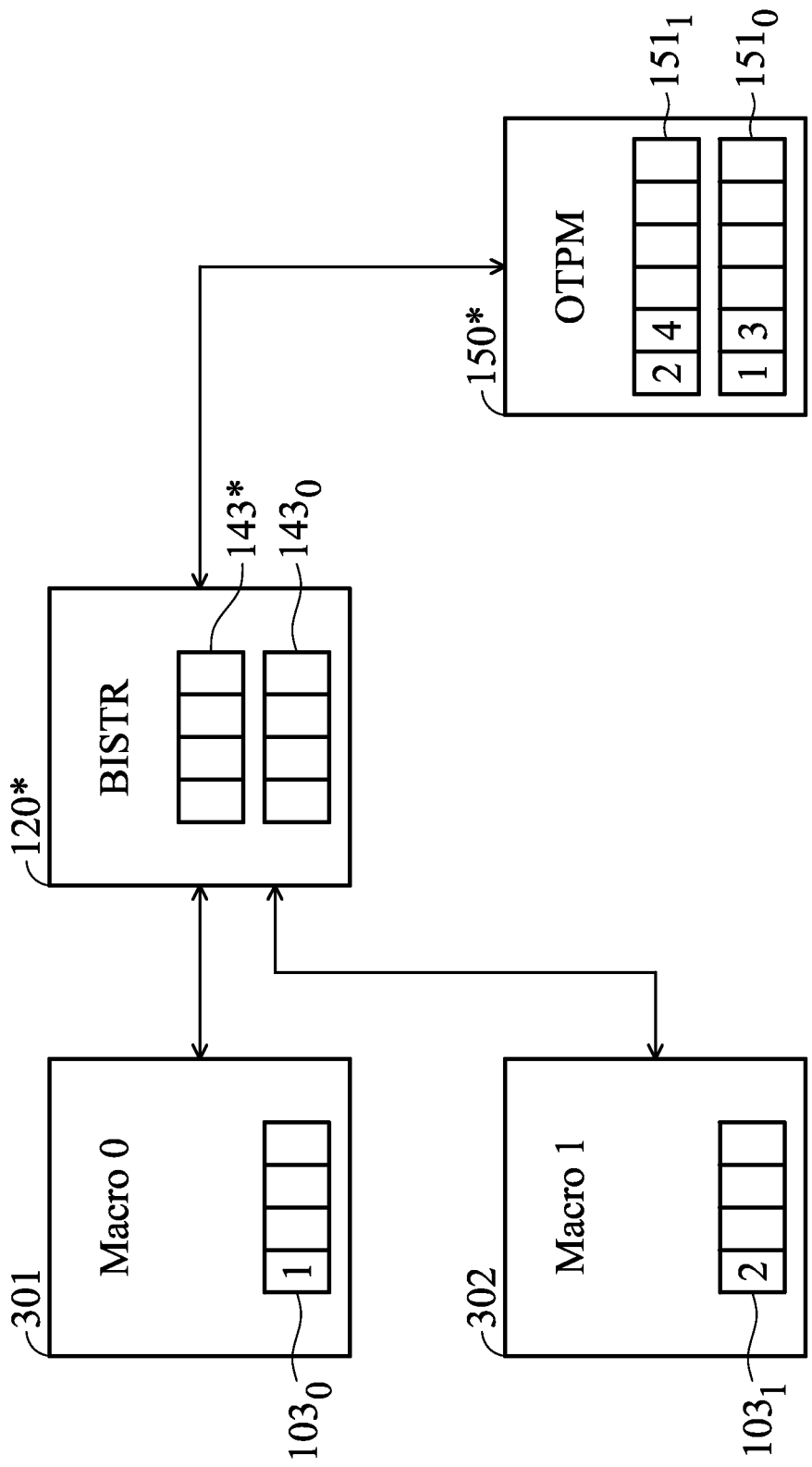

After macro0 is tested and repaired, macro1 undergoes stage-2 test-and-repair. FIGS. 3F-3I are diagrams of data exchanges that are similar to those shown in FIGS. 3B-3E and described above. For macro1, the new error register is "4". Error register "4" is also stored in repair register $103_1$ next to memory cells 114 (with null values) previously used to keep error register "2" as shown in FIG. 3I. After macro0 and macro1 are tested and repaired for new failed bits, BISTR 120* initiates a command to store the new error registers "3" and "4" in OTPM 150*, as shown in FIG. 3J, in accordance with some embodiments. OTPM 150* already has error registers "1" and "2" from previous round of test and repair, as shown in FIG. 3A. FIG. 3J shows that the new error registers (or repair data) "3" and "4" are placed in their respective OTPM segments, $151_0$ and $151_1$. The new error registers "3" and "4" are stored in memory cells used to hold error registers "1" and "2" respectively. This is enabled by storing "3" in macro0 next to memory cells 113, which are cells used to hold error register "1", and by storing "4" in macro 1 next to memory cells 114.

With the data management mechanism described above with reference to FIGS. 3A-3J, OTPM 150* is not partitioned into segments to store data collected from different test stages for an individual memory array, such as macro0 or macro1 described above, in different segments. The OTPM segments $151_0$ and $151_1$ described above are used to store error registers from different memory arrays.

The embodiments described with reference to FIGS. 3A-3J involve 2 memory arrays (macro0 and macro1). However, the two memory arrays are merely used to illustrate the test and repair mechanism involving OTPM. The mechanism can apply to memory dies or embedded memory devices with more than two memory arrays. The number of segments in the OTPM would correlate to the number of memory arrays.

The embodiments of mechanisms described above may be used to self-test and self-repair of any type of RAM, including volatile and non-volatile memories, such as static RAM (SRAM), dynamic RAM (DRAM), magnetoresistive RAM (MRAM) or flash memory, etc. The built-in self-repair analysis circuit is configurable (or parameterizable) to support different sizes and configurations of memories. The repair solutions can be designed to optimize repair efficiency for memories with different sizes and configurations for different test time specifications and different available areas (for test and/or repair devices) on chips.

The embodiments of storage mechanism of repair data, or error register data, described above enable repair data from different test stages to be stored together in the same segment without the risk of using OTPM cells that are already used. The storage mechanism employs a duplicated repair data (or error register data) storage in the BISTR module. Repair data storage and the duplicated repair data storage in the BISTR module enable differentiation of new repair data of the current test stage from the repair data of the previous test stage (s). An XOR gate in the BISTR module and a connection line between the XOR gate and the repair data storage in the memory array also assist in enabling the differentiation. Due to the differentiation of new versus old repair data (or error registers), new repair data are able to be stored in an OTPM in the available OTPM cells next to the used OTPM cells, which store repair data from previous test stage(s). Such a repair data storage mechanism resolves the waste issue associated with using designated segments of OTPM to store test results from different test stages. As a result, the usage of the OTPM for storing repair data is more efficient and the OTPM could be designed with smaller area.

In some embodiments, a method of storing repair data of a random access memory (RAM) array in a one-time programming memory (OTPM) is provided. The method includes performing a first test and repair of the RAM array by using a built-in self-test-and-repair (BISTR) module to generate first repair data for the RAM array. The RAM array has redundant rows and columns for repair. The method also includes storing the first repair data of the RAM in the OTPM, and loading the first repair data in a repair memory of the RAM array. The method further includes loading the first repair data in a repair memory and in a duplicated repair memory of the BISTR module, and performing a second test and repair of the RAM array to determine second repair data of failed bits not included in the first repair data. In addition, the method includes storing the second repair data in the repair memory of the BISTR module and in the repair memory of the RAM array, and processing the repair data in the repair memory and the duplicated repair memory of the BISTR module by a XOR gate. Additionally, the method includes storing the output of the XOR gate in the repair memory of the RAM array, and storing content of the repair memory in the OTPM.

In some other embodiments, a system for storing repair data of a random access memory (RAM) array in a one-time programming memory (OTPM) is provided. The system includes the RAM array, and the RAM array includes a main memory, redundant rows and columns, and a first repair register memory. The system also includes a built-in self-test-and-repair (BISTR) module with a second repair register memory, and the BISTR module is used to test and repair the RAM array. The system further includes a one-time programming memory (OTPM) for storing repair data from more than one test and repair stages for the RAM array. The repair data from different test and repair stages are stored in the same data segment.

In yet some other embodiments, a system for storing repair data of a random access memory (RAM) array in a one-time programming memory (OTPM) is provided. The system includes the RAM array, and the RAM array includes a main memory, redundant rows and columns, and a first repair register memory. The system also includes a built-in self-test-and-repair (BISTR) module with a second repair register memory, and the BISTR module is used to test and repair the RAM array. The second repair memory includes a repair register segment and a duplicated repair register segment. The BISTR module has a XOR gate with inputs one input from the repair register segment and the other input from the duplicated repair register segment. The system further includes a one-time programming memory (OTPM) for storing repair data from more than one test and repair stages for the RAM array. The repair data from different test and repair stages are stored in the same data segment.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of storing repair data of a random access memory (RAM) array in a one-time programming memory (OTPM), comprising:
performing a first test and repair of the RAM array using a built-in self-test-and-repair (BISTR) module to determine first repair data for the RAM array, wherein the RAM array has redundant rows and columns for repair;
storing the first repair data of the RAM in the OTPM;
loading the first repair data in a repair memory of the RAM array;
loading the first repair data in a repair memory and in a duplicated repair memory of the BISTR module;
performing a second test and repair of the RAM array to determine second repair data of failed bits not included in the first repair data;
storing the second repair data in the repair memory of the BISTR module and in the repair memory of the RAM array;
processing the repair data in the repair memory and the duplicated repair memory of the BISTR module using an XOR gate;
storing the output of the XOR gate in the repair memory of the RAM array; and
storing content of the repair memory in the OTPM.

2. The method of claim 1, wherein the output of the XOR gate makes the first repair data null and keeps the second repair data, and storing the second repair data next to the first repair data in the OTPM.

3. The method of claim 1, further comprising:
performing packaging operations on a die with the RAM array.

4. The method of claim 1, further comprising performing the steps of claim 1 on a second RAM, wherein repair data of the second RAM are stored in a separate segment in the OTPM.

5. The method of claim 4, wherein the second RAM array undergoes testing and repairing to collect additional repair data before the first repair data or the second repair data are sent to OTPM.

6. The method of claim 1, wherein the RAM array is a static RAM (SRAM), a dynamic RAM (DRAM), a magnetoresistive RAM (MRAM) or a FLASH memory.

7. The method of claim 1, wherein the OTPM is effuse-based or antifuse-based.

8. The method of method 1, wherein the first repair data and the second repair data are stored in a same segment and are next to one another in the OTPM.

9. The method of claim 1, wherein the first repair data are collected on a wafer level and the second repair data are collected from a packaged die.

10. The method of claim 1, wherein the first repair data and the second repair data include addresses of failed cells and address of redundant cells used to repair the failed bits.

11. A system for storing repair data of a random access memory (RAM) array in a one-time programming memory (OTPM), comprising:
the RAM array, wherein the RAM array includes a main memory, redundant rows and columns, and a first repair register memory;
a built-in self-test-and-repair (BISTR) module having a second repair register memory, wherein the BISTR module is used to test and repair the RAM array; and
the one-time programming memory (OTPM) for storing repair data from more than one test and repair stages for the RAM array, wherein the repair data from different test and repair stages are stored in a same data segment.

12. The system of claim 11, wherein the second repair register memory of the BISTR module includes a repair register segment and a duplicated repair register segment; and wherein the BISTR module has a XOR gate having one input from the repair register segment and another input from the duplicated repair register segment.

13. The system of claim 12, wherein the XOR gate is configured to send an output to the first repair register memory by a connection line.

14. The system of claim 12, wherein the BISTR module further includes an OTPM controller configured to send data to and from the first repair register in the RAM array and the OTPM.

15. The system of claim 11, wherein the RAM array is a static RAM (SRAM), a dynamic RAM (DRAM), a magnetoresistive RAM (MRAM) or a FLASH memory.

16. The system of claim 11, wherein the OTPM is efuse-based or antifuse-based.

17. The system of claim 11, wherein the BISTR module includes a built-in self-test module and a built-in self-repair module.

18. The system of claim 11, wherein the system is part of a semiconductor die, and wherein connectors are formed on the semiconductor die to connect with the RAM array after the first repair data are collected.

19. The system of claim 11, further comprises:
another RAM array, wherein the other RAM array includes another main memory, additional redundant rows and columns, and a third repair register memory, and wherein the BISTR module is configured to test and repair the other RAM array; and the OTPM is also configured to store repair data from more than one test and repair stage for the other RAM array.

20. A system for storing repair data of a random access memory (RAM) array in a one-time programming memory (OTPM), comprising:
the RAM array, wherein the RAM array includes a main memory, redundant rows and columns, and a first repair register memory;
a built-in self-test-and-repair (BISTR) module having a second repair register memory, wherein the BISTR module is used to test and repair the RAM array, and wherein the second repair memory includes a repair register segment and a duplicated repair register segment; and wherein the BISTR module has a XOR gate having one input from the repair register segment and another input from the duplicated repair register segment; and
the one-time programming memory (OTPM) configured for storing repair data from more than one test and repair stages for the RAM array, wherein the repair data from different test and repair stages are stored in a same data segment.

* * * * *